(12) United States Patent
Ball

(10) Patent No.: US 9,263,217 B2
(45) Date of Patent: Feb. 16, 2016

(54) PROTECTIVE SWITCH WITH STATUS DETECTION

(75) Inventor: Roy Ball, Coral Springs, FL (US)

(73) Assignee: ABB Technology, AG, Zurich (CH)

( * ) Notice: Subject to any disclaimer, the term of this patent is extended or adjusted under 35 U.S.C. 154(b) by 83 days.

(21) Appl. No.: 13/580,101

(22) PCT Filed: Feb. 18, 2011

(86) PCT No.: PCT/US2011/025483
§ 371 (c)(1),
(2), (4) Date: Oct. 19, 2012

(87) PCT Pub. No.: WO2011/106261
PCT Pub. Date: Sep. 1, 2011

(65) Prior Publication Data
US 2013/0120090 A1    May 16, 2013

Related U.S. Application Data

(60) Provisional application No. 61/307,063, filed on Feb. 23, 2010.

(51) Int. Cl.
*H01H 77/00* (2006.01)
*H01H 83/00* (2006.01)
*H01H 71/04* (2006.01)
*H01H 83/04* (2006.01)
*G01R 31/327* (2006.01)

(52) U.S. Cl.
CPC ............. *H01H 71/04* (2013.01); *H01H 83/04* (2013.01); *G01R 31/3277* (2013.01); *H01H 2071/048* (2013.01)

(58) Field of Classification Search
CPC ..................................................... H01H 71/04

USPC ............................................................ 335/17
See application file for complete search history.

(56) References Cited

U.S. PATENT DOCUMENTS

| | | | | |
|---|---|---|---|---|
| 3,955,162 A | * | 5/1976 | Nicol ..................... | H01H 71/00 335/13 |
| 4,945,345 A | * | 7/1990 | Proctor .................. | H01H 73/14 335/17 |
| 5,264,673 A | * | 11/1993 | Powell ................... | H01H 71/46 200/308 |
| 5,939,991 A | * | 8/1999 | Deng ...................... | H02H 3/04 335/17 |

(Continued)

FOREIGN PATENT DOCUMENTS

| | | |
|---|---|---|
| DE | 202009007211 U1 | 10/2009 |
| JP | 9056018 A | 2/1997 |
| WO | 2011106261 | 9/2011 |

OTHER PUBLICATIONS

The Patent Office of the People's Republic of China, First Office Action for Application No. 201180018329.5, Mailed May 27, 2014 (Translation).

(Continued)

*Primary Examiner* — Alexander Talpalatski
(74) *Attorney, Agent, or Firm* — Taft Stettinius & Hollister LLP

(57) ABSTRACT

A protective switch assembly (100) includes switch position sensors (109) that sense switch blade (14) position and indicate whether one or more switches (104) are open. According to another aspect, the voltage and current of the switch circuits are monitored to determine switch position as well as overall circuit status.

6 Claims, 16 Drawing Sheets

(56) References Cited

U.S. PATENT DOCUMENTS

| | | | |
|---|---|---|---|
| 6,400,547 B1 * | 6/2002 | Pohl | H01H 9/167 361/111 |
| 7,015,403 B2 * | 3/2006 | Houck, III | H01H 71/04 200/50.05 |
| 7,563,999 B2 | 7/2009 | Ball et al. | |
| 7,706,927 B2 | 4/2010 | Naumann et al. | |
| 7,915,982 B2 * | 3/2011 | Chiesi | H01H 71/04 200/308 |
| 8,289,026 B2 * | 10/2012 | Keil | H01H 50/08 324/415 |
| 2004/0130217 A1 * | 7/2004 | Moldovan | H03K 17/97 307/125 |
| 2005/0046526 A1 * | 3/2005 | Lipsey, II | H01H 73/14 335/17 |
| 2006/0059681 A1 * | 3/2006 | Ball | G01R 31/3272 296/622 |
| 2006/0139858 A1 * | 6/2006 | Lewis | H01H 71/04 361/627 |
| 2007/0085638 A1 * | 4/2007 | Zindler | H01H 71/04 335/132 |
| 2007/0171056 A1 * | 7/2007 | Beyer | H01H 9/167 340/545.2 |
| 2008/0011589 A1 | 1/2008 | Ball et al. | |
| 2008/0036562 A1 * | 2/2008 | Adunka | H01H 1/0015 335/156 |
| 2009/0242367 A1 * | 10/2009 | Bruel | H01H 9/167 200/308 |
| 2010/0023284 A1 * | 1/2010 | Rodseth | H01H 11/0062 702/60 |
| 2010/0238611 A1 * | 9/2010 | DeBoer | H01H 71/0271 361/634 |

OTHER PUBLICATIONS

The Patent Office of the People's Republic of China, First Office Action for Application No. 201180018329.5, Mailed May 27, 2014 (Original).

The Patent Office of the People's Republic of China, Second Office Action for Application No. 201180018329.5, Mailed Feb. 4, 2015 (Translation).

The Patent Office of the People's Republic of China, Second Office Action for Application No. 201180018329.5, Mailed Feb. 4, 2015 (Original).

* cited by examiner

PROTECTIVE SWITCH WITH STATUS DETECTION

FIELD OF INVENTION

The present application is directed to protective relay switches, and more particularly to test switches having status detection means.

BACKGROUND

Protective relays are commonly used in electric utility applications to detect various possible problems in the electrical power output and thus protect expensive equipment such as motors and generators. Protective relays continuously monitor power systems to assure maximum continuity of electrical service with minimum damage to life and property.

Some of today's protection applications are, without limitation: motor, generator, transformer, station-bus, line and circuit, system ground, network systems, pilot wire, pilot channel, transmission line, pilot relying, backup, reclosing, synchronizing, load-shedding, frequency and many more. Typically, protective relays, meters and instruments receive their input signals from sensors (commonly current transformers and potential transformers) which step down the high current and voltages and provide a proportional output signal.

The relay terminals are connected to the transformers/sensors through a test switch terminal or "poles". Each test switch can be associated with one or more relays. Test switches provide the necessary short circuiting of line and load terminals when the relay is removed from its case or the adjacent test switch is opened. In this manner, the test switch disconnects the protective relay from the sensors for the purposes of calibration and/or replacement. Thus, test switches are the means by which protective relays are disabled. Additionally, test switches provide an access point for maintenance personnel to directly measure current/potential values using meters, for example, test plugs.

An exemplary prior art test switch assembly is shown in FIG. 1 and generally indicated by the numeral 10. The wide variety of test switches available allows for many types of applications. As is well known to those of ordinary skill in the art, these applications may include test switches with all potential switches, all current switches or some combination thereof.

Test switch assembly 10 includes on its front face 10 switches 12a to 12j arranged in five (5) sets. In the embodiment shown in FIG. 1 for prior art test switch 10 there are two switches, namely switch 12a and 12b, which are associated with a respective current transformer (not shown). Test switch 10 also includes eight (8) potential switches, namely switches 12c and 12d, 12e and 12f, 12g and 12h, 12i and 12j.

One example of a pair of switches associated with a current transformer is shown in FIGS. 2a and 2b. The paired switches include a switch, such as switch 12a which has a shorting blade 14 having a handle 26 (switch 12a, when unpaired, may be a potential switch) and a switch 12b which does not have a shorting blade and instead includes a test jack 16. The input from the current transformer is connected to the bottom connector 17 of switch 12a. The electrical current travels through shorting blade 14 and out the top connector 18 of switch 12a, which is in turn electrically connected to a relay. The electrical current travels back from the relay, to top electrical connector 19, through test jack 16 and back to the current transformer through the bottom electrical connector 20 of switch 12b. A shorting tab 22 extends from the bottom of switch 12b to a location beneath switch 12a. Shorting tab 22 is electrically connected to bottom connector 20 of switch 12b.

During normal operation, with the shorting blade 14 closed, electrical current flows from the current transformer to, bottom connector 17, through the shorting blade 14, to the top connector 18 and from there to the relay. The electrical current returns from the relay through to connector 19, through the test jack 16, to the bottom connector 20, and from there, to the transformer. If, however, an operator wishes to remove the current signal from the relay, the shorting blade 14 is opened. As the blade 14 is rotated, and before it is electrically disconnected from top connector 18, a bottom edge 24 of shorting blade 14 engages the shorting tab 22, thereby electrically connecting bottom connector 17 with bottom connector 20. Thereafter, the blade 14 disconnects from top connector 18 and the current signal to the relay is stopped. By shorting out the circuit first, the current always has a path to travel, thereby preventing dangerous voltage buildup in the transformer.

On the rear face of test switch assembly 10, twenty terminals are provided for connection to the relays and sensors/transformers. When test switch 10 is mounted in a switchboard panel (not shown) the switches 12a to 12j are accessible from the front of the panel and the terminals on the rear face are only accessible from the rear of the panel.

Though prior art test switches have proved remarkably dependable, drawbacks persist. For example, in some instances a maintenance person could disable a relay (via the test switch), for troubleshooting or maintenance purposes. The power system may be restored and the test switch unintentionally left in a configuration that disables the device. Such conditions could cause the protection and control equipment to fail.

Other potential issues exist that may affect relay performance, such as blown fuses, changed wires, or changes to the topology of the protection and control scheme (either intentional or unintentional). Any of these conditions may lead to incorrect operations or failures of the relay. It is therefore desirable to verify all the correct signal inputs to the test switch prior to restoration of the power system.

SUMMARY OF THE INVENTION

According to one aspect of the present invention a switch assembly is provided for selectively opening and closing the electrical connection between a protective relay and a potential or current sensor. The switch assembly includes a plurality of individual switches including blades movable between an open and a closed position, the switches being electrically connected between the protective relay and the potential or current sensor. A switch position sensor is positioned proximate to the blade in each of the plurality of individual switches to sense when the blade is in the open or closed position. An indicator optically displays whether any one of the blades is in the open position based on signals from said switch position sensors.

According to another aspect of the present invention, a system is provided for selectively opening and closing the electrical connections between one or more protective relays and a potential or current transformer. The system includes a plurality of switch assemblies each including a plurality of individual switches including blades movable between an open and a closed position. The switches are electrically connected between the protective relay and the potential or current transformer. Each switch assembly includes at least one sensor to monitor the signal from the potential or current transformer. A monitoring module is in communication with the at least one sensor. The monitoring module determines from the output of the sensor, whether at least one of said switches is open or closed.

DETAILED DESCRIPTION OF THE INVENTION

Figure 1:
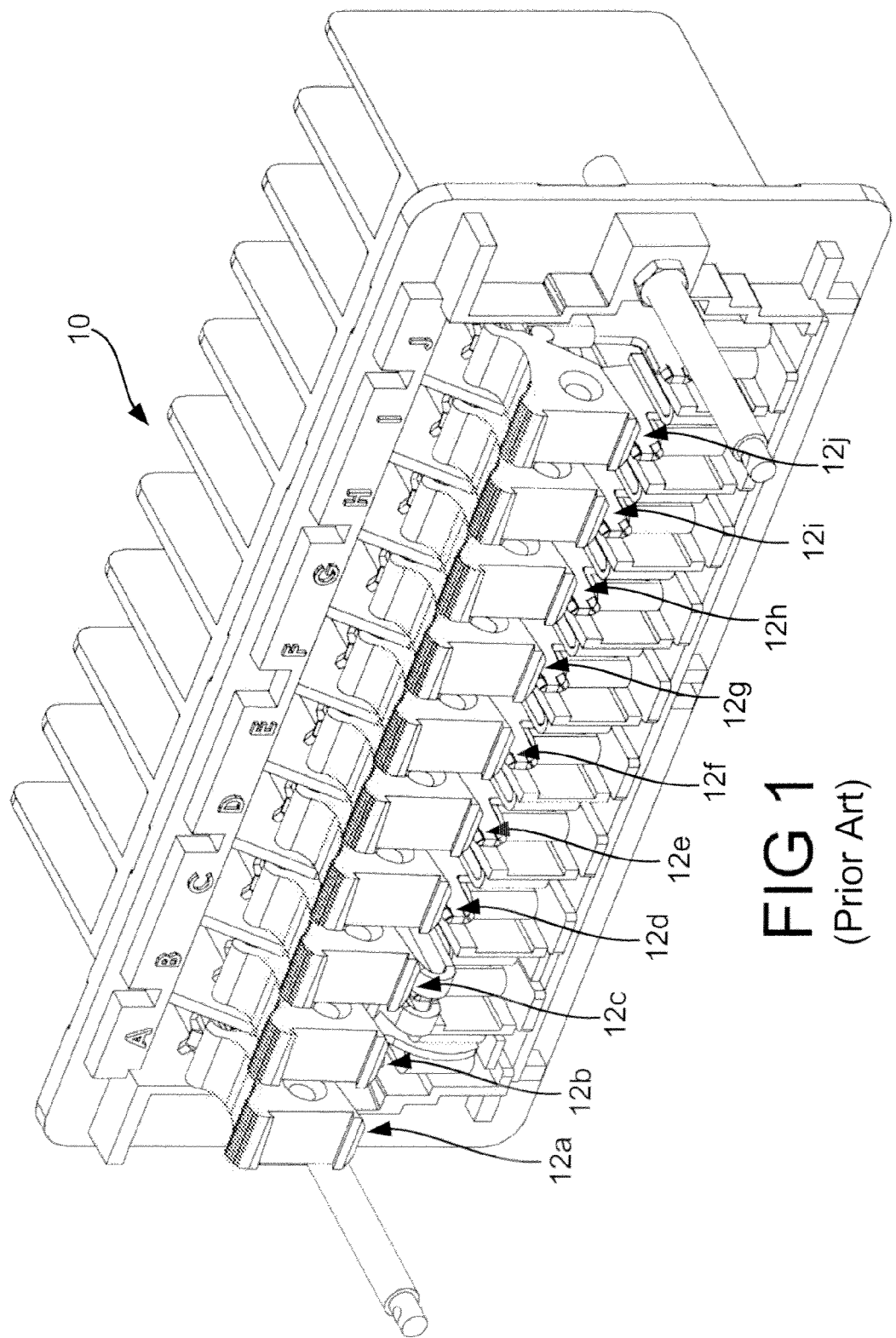
FIG. 1 is an isometric view of a prior art test switch assembly.
Figure 2B:
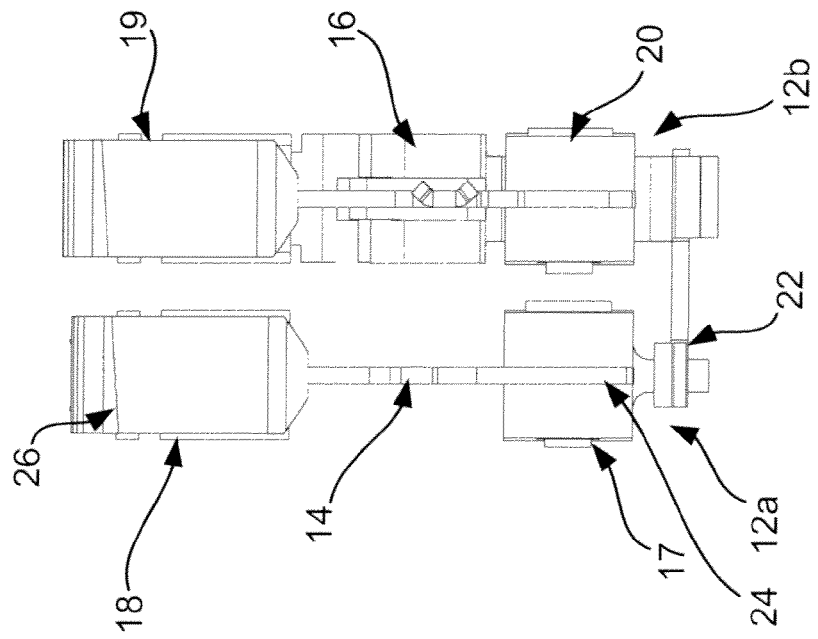
FIG. 2b is a front view of a prior art ganged test switch for a current transformer.
Figure 2A:
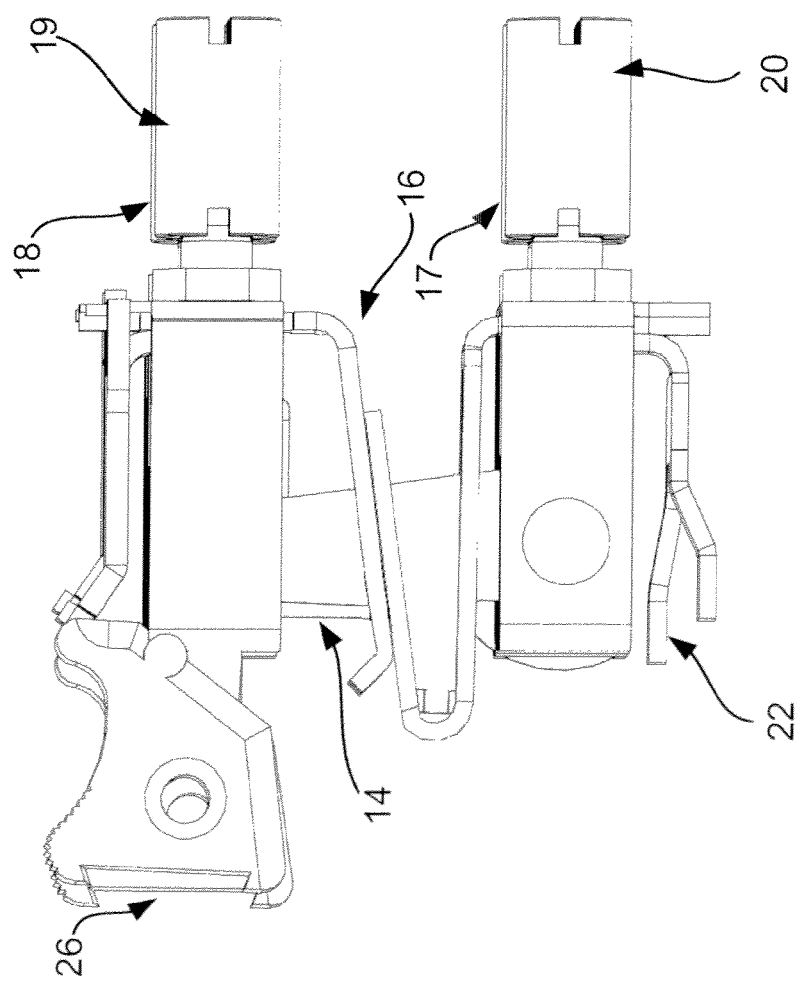
FIG. 2a is a side view of a prior art ganged test switch for a current transformer.
Figure 3:
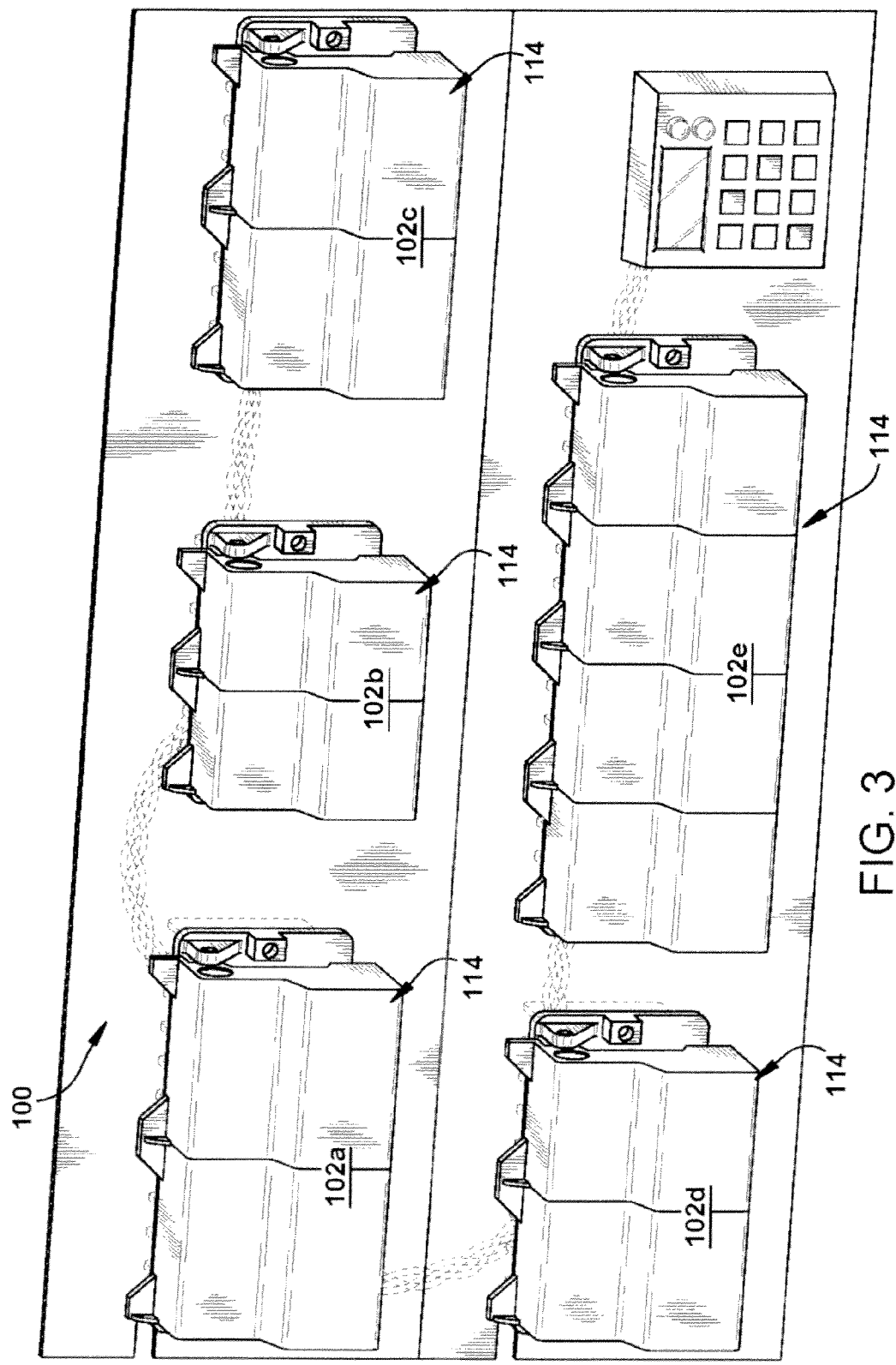
FIG. 3 is an elevated view of an installation including a plurality of test switch assemblies.

With reference now to FIG. 3, an exemplary installation 100 is shown, including a plurality of switch assemblies 102. Switch assemblies 102 each include a plurality of individual switches 104 that are modular and horizontally stackable to provide flexibility and efficiency. Each switch assembly 102 includes a plurality of individual switches 104 (see FIG. 4) arranged in a logical grouping and covered by a movable safety cover. For example, one switch assembly 102a may include switches 104 for differential protection for a transformer. A second switch assembly 102b may include switches 104 for the primary protection for a transformer. A third grouping 102c may include switches 104 for backup protection for a transformer. Another logical grouping 102d may include switches 104 for all protection for a given transformer. Any number of groupings may be used, to provide a convenient interface for an operator.

Figure 4:
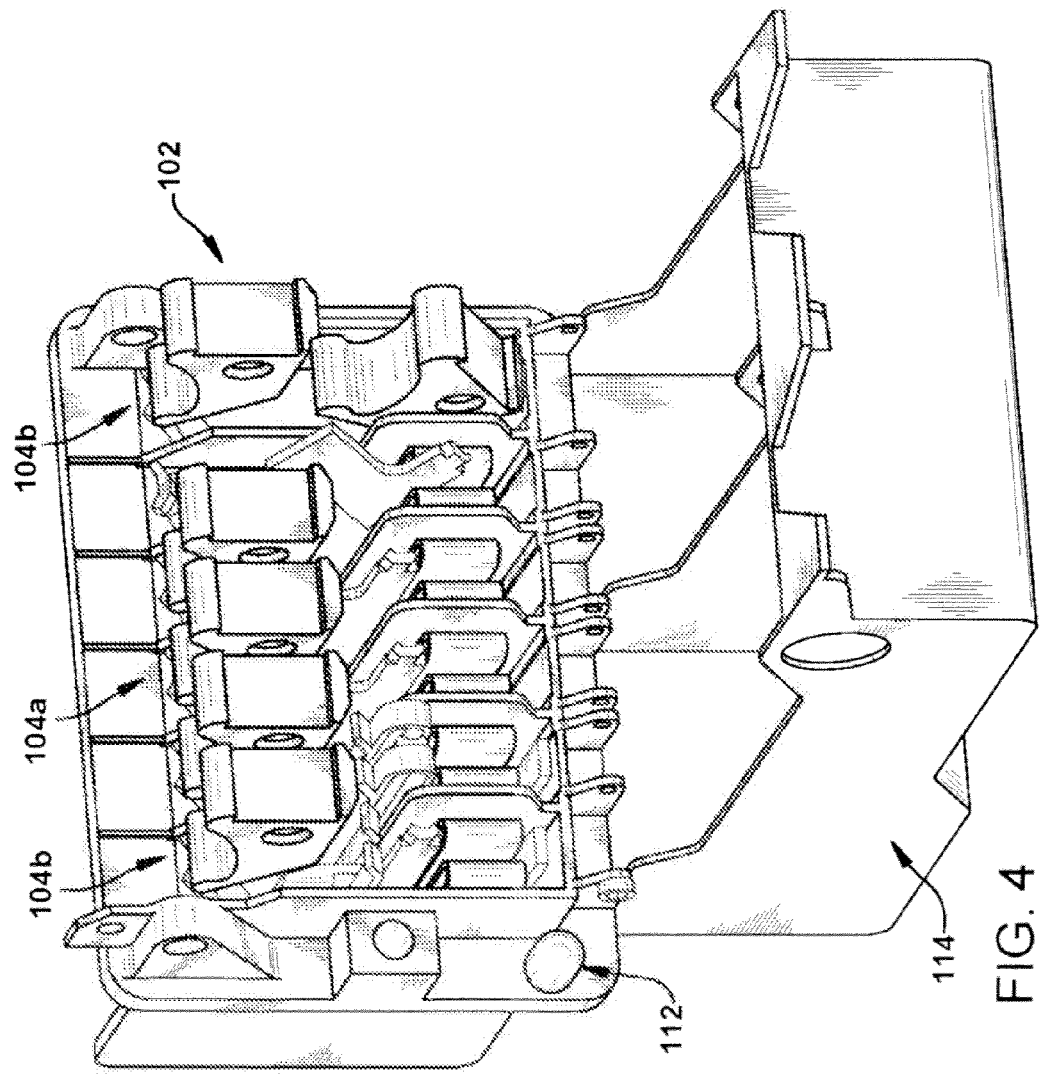
FIG. 4 is an elevated front and right side view of a test switch assembly according to the present invention.
Figure 5:
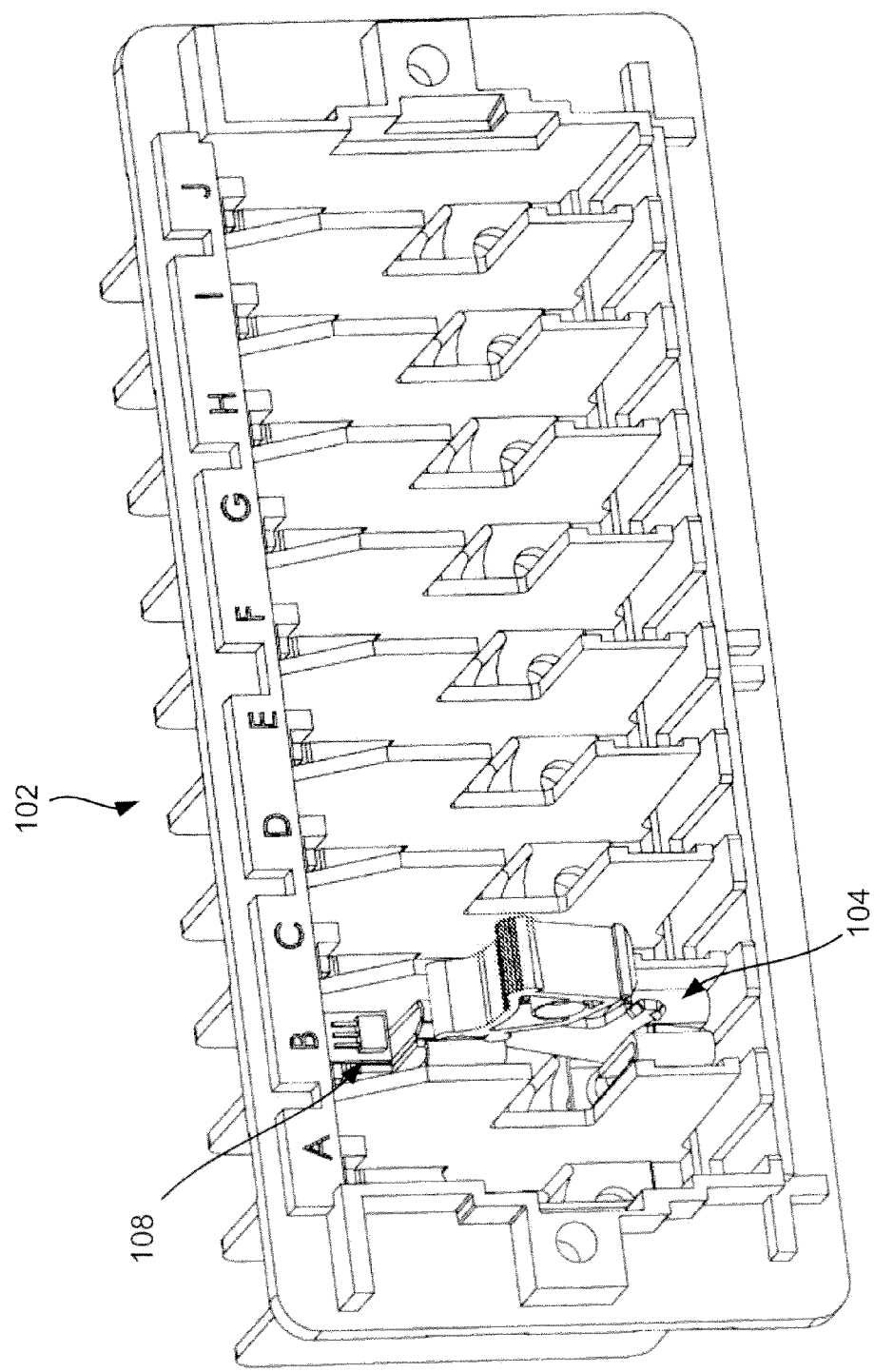
FIG. 5 is an elevated front and right view of a test switch assembly with all but one test switch removed.

With reference now to FIG. 4, as discussed above, each switch assembly 102 includes a plurality of switches 104 that may be modular and stackable. Inner switches 104a are bounded on each side with end switches 104b. With reference now to FIG. 5, in order to improve clarity, a switch assembly 102 is shown with the electrical components of all but one switch removed. As can be seen, the switch includes a sensor 108 positioned proximate to the handle 26 of the blade when in the closed position. Sensor 108 detects the presence of the pivotable blade 14 when in the closed position. Sensor 108 may be one of a plurality of types of proximity sensors. For example, sensor 108 may be an RF sensor, wherein an RFID tag is secured to the handle or blade. According to this embodiment, when blade 14 is pivoted to the open position, the RFID tag will go out of the range of the receiver triggering a status change. According to another embodiment, the sensor 108 may be a hall sensor which detects a small magnet positioned on the blade 14 or handle 26. According to yet another embodiment, sensor 108 may be an optical sensor that detects when the blade or handle is in the closed orientation.

Each switch assembly 102 includes a switch position indicator 112 (see FIG. 4) that indicates if any of the switches in the switch assembly are in the open configuration. According to one embodiment, indicator 112 may include one or more LEDs capable of alternately emitting a green or red light. According to one embodiment, if all sensors 108 of a switch assembly 102 sense their respective switch in the closed configuration (e.g. blade 14 at approximately 90 degrees closing the electrical connection between a bottom and top electrical connector) the indicator 112 emits a green light. However, if any one of the sensors 108 detects that their respective switch 104 is in a position other than closed (i.e. blade 14 pivoted away from the switch assembly as shown in FIG. 4), the indicator 112 emits a red light. Each switch assembly 102 includes a cover 114 that pivots between an open (see FIG. 4) and closed (see FIG. 3) position. Cover 114 may be clear or opaque. Accordingly, to accommodate an opaque cover, the indicator 112 is positioned outside of the area covered by cover 114 so that an operator can see the indicator 112 even when cover 114 is closed.

Figure 6:
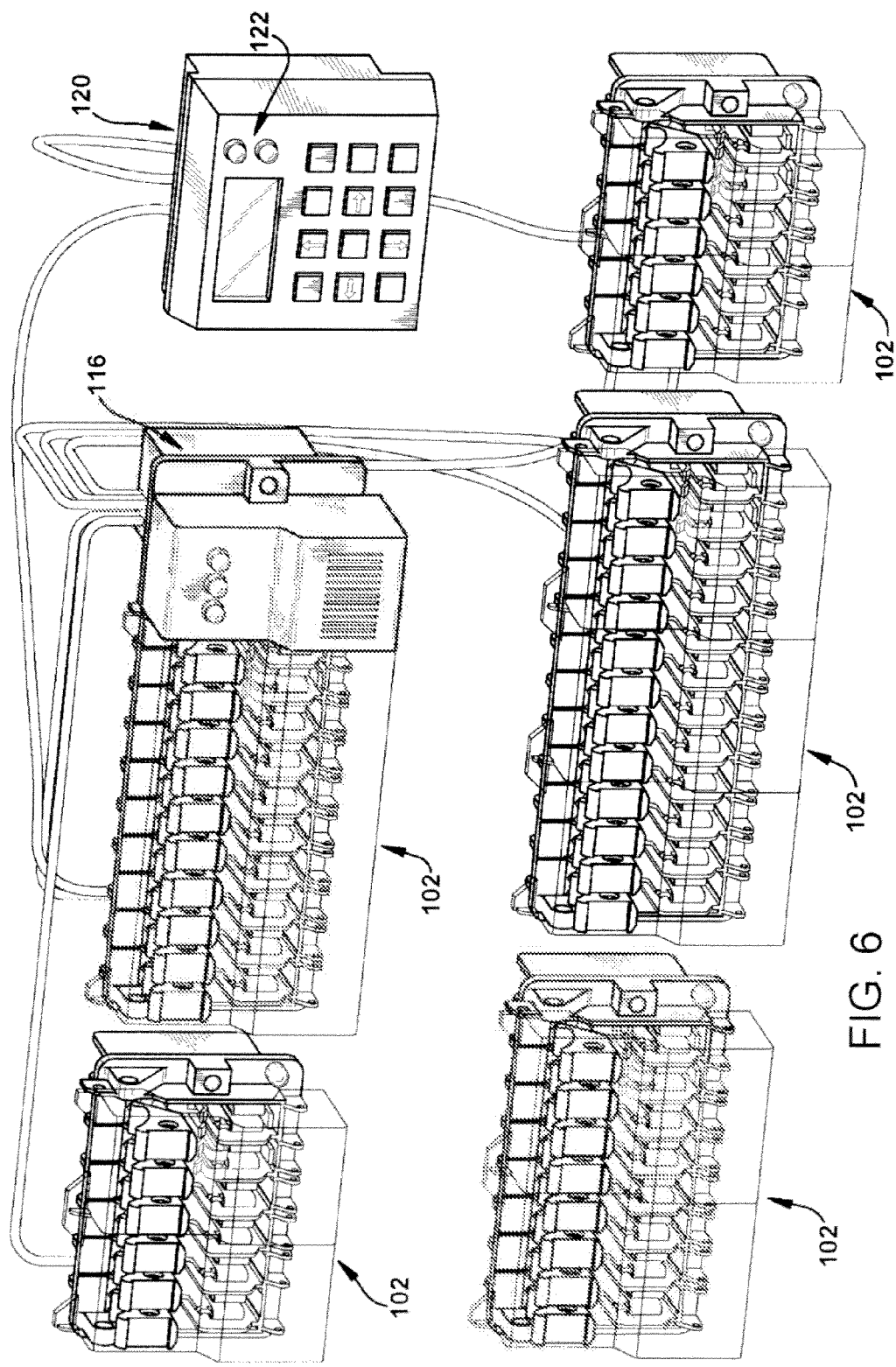
FIG. 6 is an elevated front and left side view of an installation including a plurality of test switch assemblies, a power supply module and a monitoring module.

The sensor 108 and indicator 112 may draw power from the circuit to being monitored or, preferably, receives power from a power module 116. As shown in FIG. 6, a single power module 116 may provide power for all switch assemblies 102 in an installation 100. According to other embodiments, a power module 116 may be provided for each switch assembly 102.

Each installation 100 may also include a monitoring module 120 that is in electrical communication with sensors 108. Monitoring module 120 may accordingly provide a separate indicator 122 that indicates if any one of the switches 104 in the installation 100 is open. In order to minimize data transfer size and simplify interpretation, each switch assembly 102 may provide a single signal indicative of the overall status of the switches to the monitoring module 120. The output from each switch assembly 102 may be a binary signal (good/bad or high/low). Monitoring module 120 is capable of receiving status signals from multiple switch assemblies and in turn is in communication with a control room or other remote location to transmit switch status information.

Monitoring module 120 may further facilitate the direct monitoring of the signals being output from the instrument transformers (as will be discussed below in greater detail). Directly monitoring the circuit between the relay and the instrument transformers provides many advantages. Specifically, this approach enables the detection of additional causes of faulty operation, for example a blown fuse on a potential transformer. Signal measurement at the switch can determine not only that the test switch is in the correct closed position but also that the proper signals are applied to the relay prior to power system restoration. The use of the signal measurements on the switch opens the new possibilities to diagnose problems on current and potential transformers. Until now there has been little focus on what may be the weakest link of the power system. If the instrument transformers cannot accurately replicate the conditions of the primary power system due to failures or degradation, such systems and associated protection and control schemes will be compromised.

The reading of the voltages and currents from a current transformer can provide valuable information to calculate baseline values that can be compared to future operating values and monitor degradation of the products. Similarly, on potential circuits, industry practice is to only read voltages. Thus, according to one aspect of the invention, each switch includes integrated voltage and/or current sensors in accordance with the configurations shown below. The sensor measurements may be transmitted to the monitoring module 120 where analysis may be performed and/or the data is transmitted to remote locations.

Figure 7:
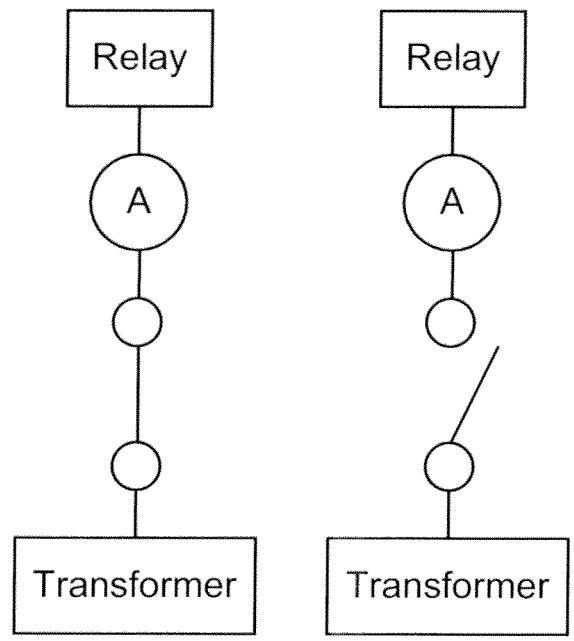
FIG. 7 is a schematic view of a second monitoring scheme for a potential switch.

With reference now to FIG. 7, in a potential switch, the current is monitored at A to determine the status of the switch (opened or closed). According to this embodiment, the presence of current at A indicates a closed pole and the absence of current at A indicates an open pole.

Figure 8:
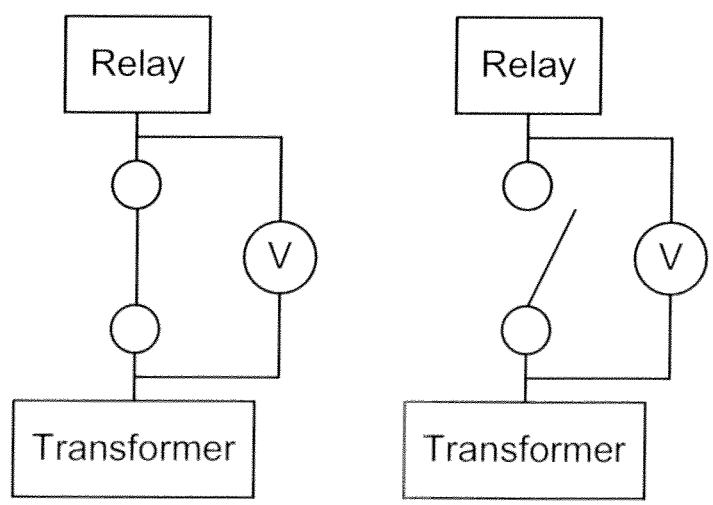
FIG. 8 is a schematic view of a second monitoring scheme for a potential switch.

With reference now to FIG. 8, in a potential switch, the differential voltage is monitored across the switch to determine the status of the switch (opened or closed). According to this embodiment, a zero or very low voltage reading (nominal absence of voltage) indicates a closed switch. A nominal voltage reading (or nominal presence of voltage) indicates an open switch.

Figure 9:
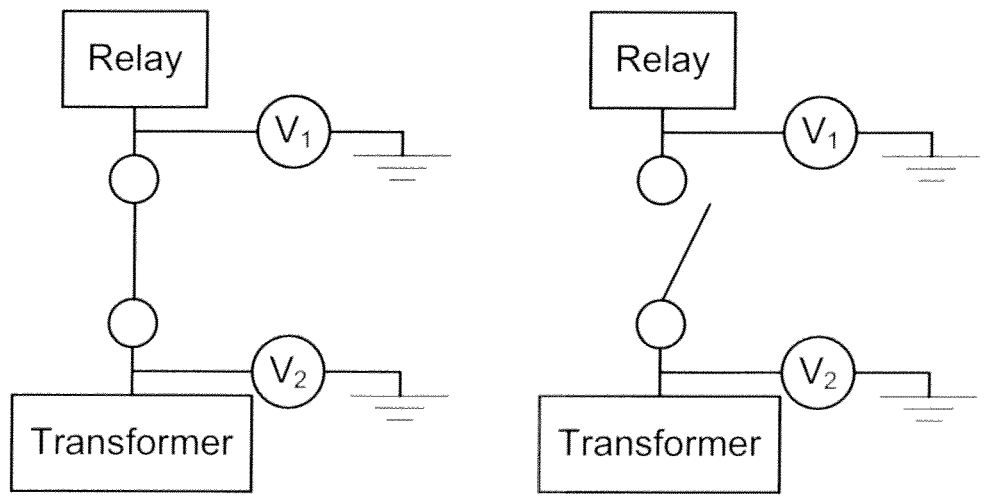
FIG. 9 is a schematic view of a third monitoring scheme for a potential switch.

With reference now to FIG. 9, in a potential switch, the voltage is measured across the switch relative to a common ground or other reference point in the system. This approach has the added advantages of eliminating the possibility of floating voltages, and the system voltages can be read directly and used for other purposes. According to this embodiment, if $V_1$ is subtracted from $V_2$, resulting in a zero or very low voltage reading, this indicates a closed switch. If $V_1$ has a zero voltage reading, but $V_2$ has a non-zero voltage reading, this indicates an open switch. If both $V_1$ and $V_2$ have a zero or very low voltage reading, this indicates that system power is off. Thus, in the embodiment of FIG. 9, it is possible to differentiate between an open, closed and power system off condition.

Figure 10:
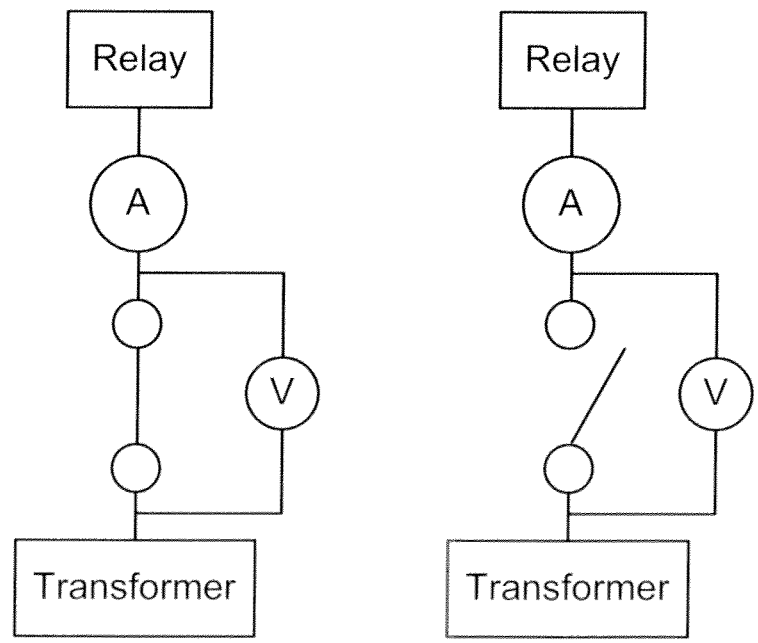
FIG. 10 is a schematic view of a fourth monitoring scheme for a potential switch.

With reference now to FIG. 10, in a potential switch, the voltage is measured across the switch and the current is measured at A. This method uses both current and voltage measurements to monitor switch status. According to this embodiment, the absence of current at A along with a voltage across the switch indicates an open switch. The presence of current at A along with the absence of a voltage across the switch indicates an open pole. When no signal is received from the power system, both the voltage and current will read zero. In this manner, each of the three system statuses (switch open, switch closed, no signal from the transformer) are distinguishable. Accordingly, this arrangement does not have the limitation of incorrect indications when the power system is off.

Figure 11:
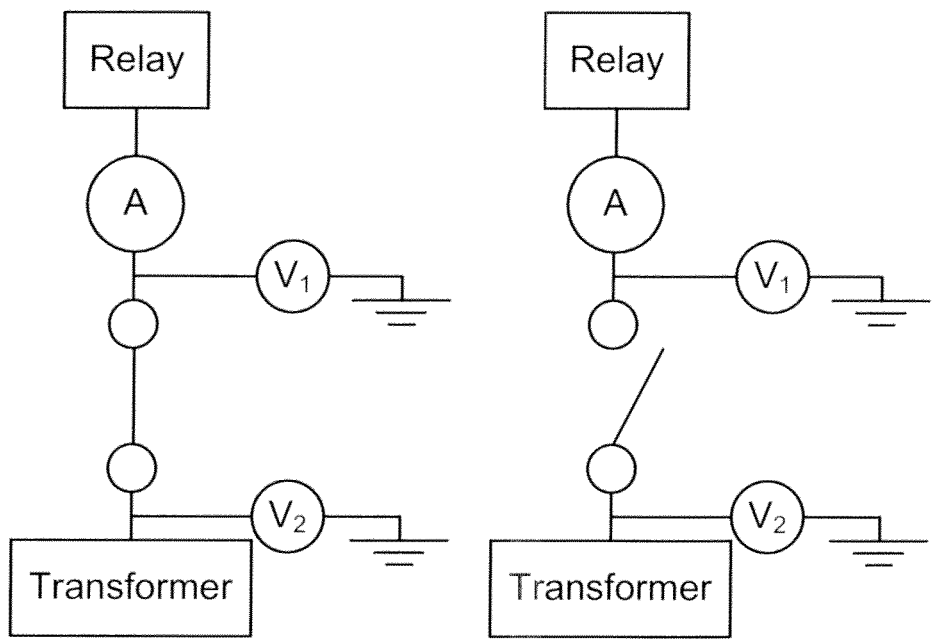
FIG. 11 is a schematic view of a fifth monitoring scheme for a potential switch.

With reference now to FIG. 11, in a potential switch, the current is measured at A and the voltage is measured across the switch relative to a common ground or other reference point in the system. According to this embodiment, the absence of current at A along with a differential voltage ($V_2-V_1$) that is other than zero indicates an open switch. The presence of current at A along with a voltage differential ($V_2-V_1$) that has a zero or very low voltage reading indicates a closed pole. When no signal is received from the power system, both the voltage and current will read zero. In this manner, each of the three system statuses (switch open, switch closed, no signal from the transformer) are distinguishable. Further, this configuration eliminates the possibility of floating voltages. Also, the voltage values may be read directly and used for other monitoring functions.

Figure 12:
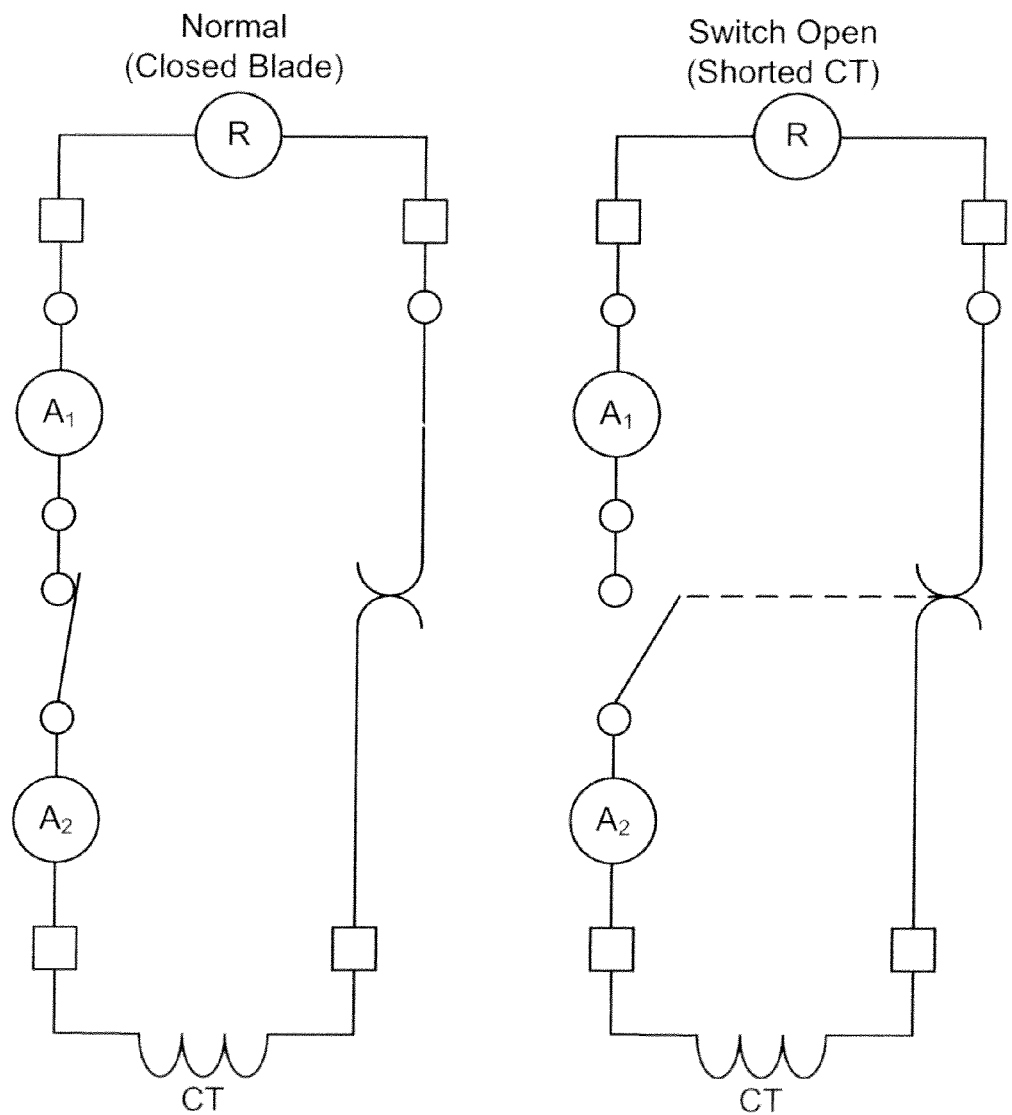
FIG. 12 is a schematic view of a first monitoring scheme for a ganged current switch.

With reference now to FIG. 12, in a ganged current switch, the current is measured at two locations. The current is measured at $A_1$ on the relay side (load side) and at $A_2$ on the current transformer side (source side). According to this embodiment, the presence of similar current readings ($A_1=A_2$) indicates the switch is closed (normal operation). If a positive current is measured at $A_2$ but $A_1$ reads zero or very close to zero, this indicates that the switch is open. If both $A_1$ and $A_2$ measure zero, this indicates no current signal is being output from the transformer (sensor).

Figure 13:
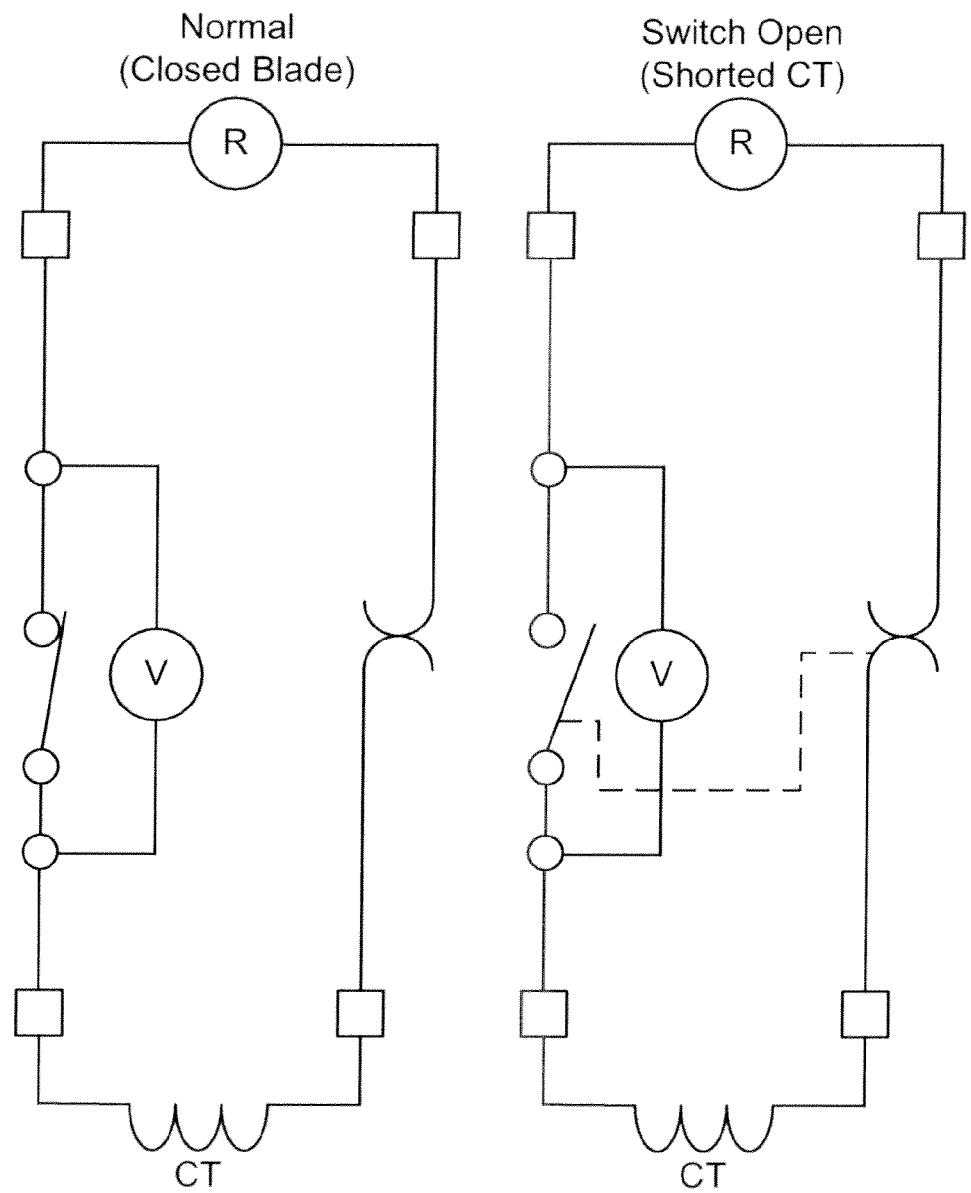
FIG. 13 is a schematic view of a second monitoring scheme for a ganged current switch.

With reference now to FIG. 13, in a ganged current switch, the voltage is measured across the shorting blade switch. If the voltage measurement is zero or very low, this indicates the switch is closed in the normal operating position. If a voltage is measured across the switch, this indicates that the switch is open.

Figure 14:
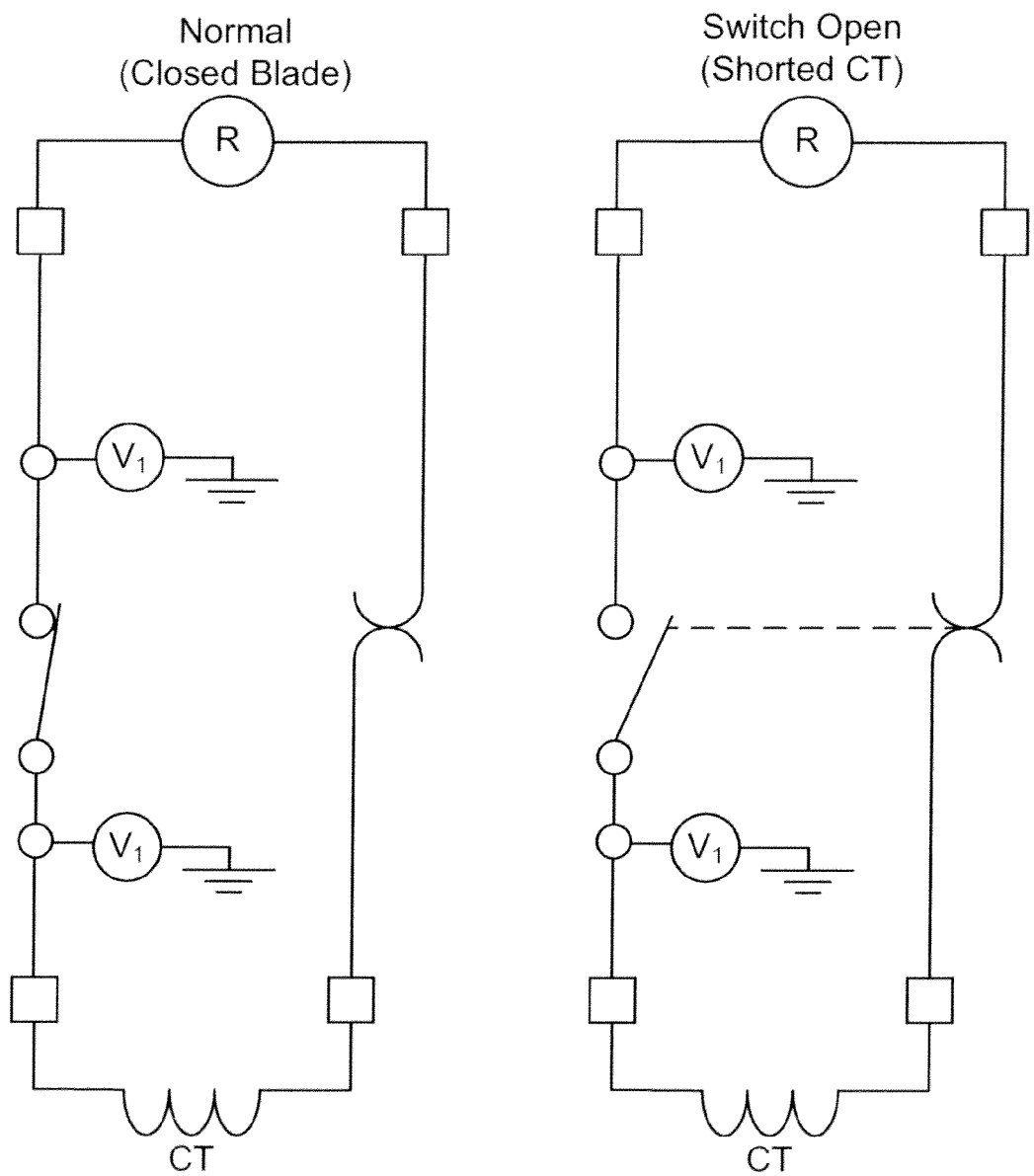
FIG. 14 is a schematic view of a third monitoring scheme for a ganged current switch.

With reference now to FIG. 14, in a ganged current switch, the voltage is measured relative to ground or a reference point on the load side and supply side of the switch. It has the added advantages of eliminating the possibility of floating voltages, and the system voltages can be read directly and used for other purposes. According to this embodiment, if $V_1=V_2$, this indicates the switch is closed in normal operation. If $V_1$ does not equal $V_2$, this indicates the switch is open.

Figure 15:
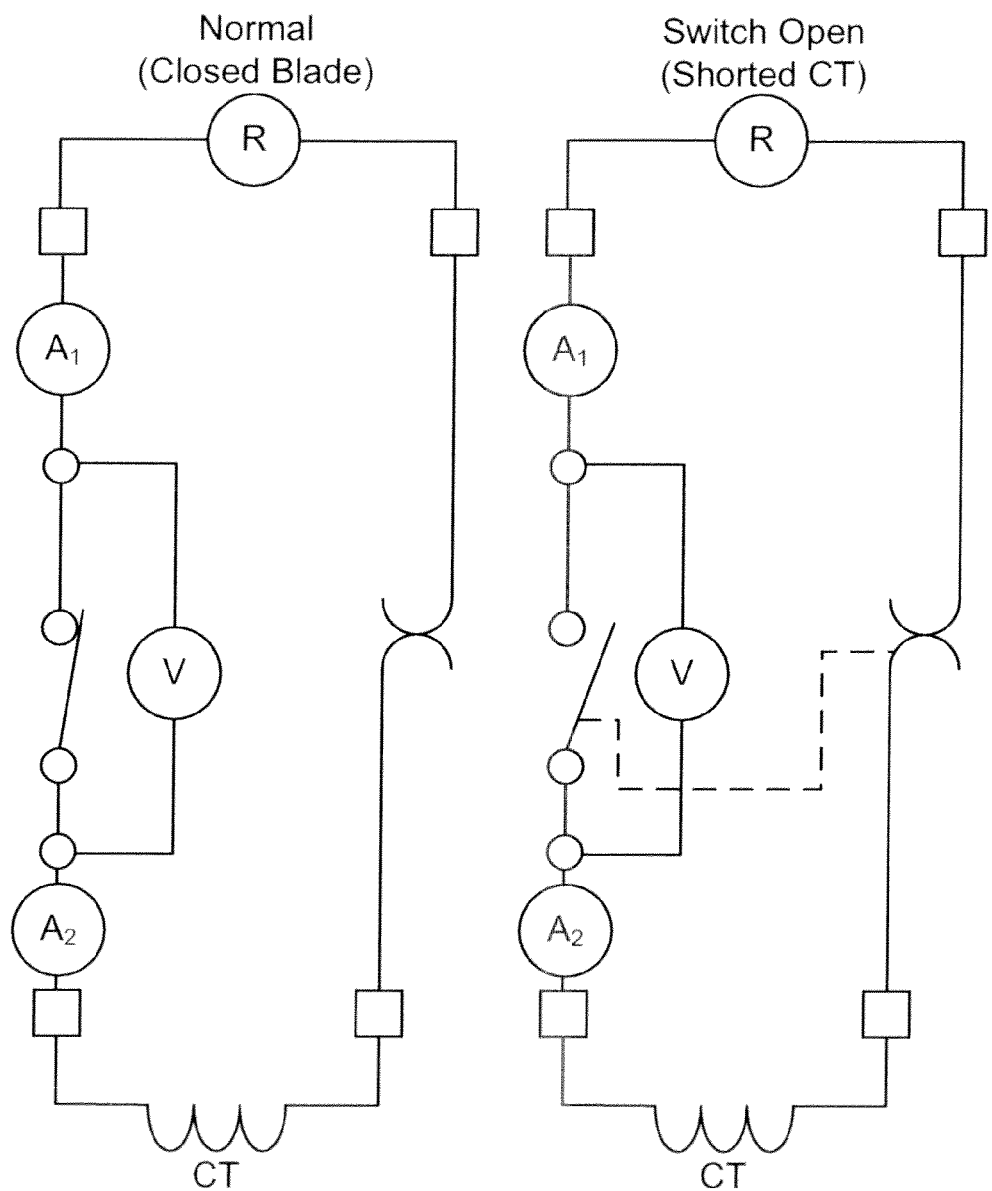
FIG. 15 is a schematic view of a fourth monitoring scheme for a ganged current switch.

With reference now to FIG. 15, in a ganged current switch, current at both the load and supply side of the switch are measured, as well as voltage across the switch. During a closed switch (or normal) operation, the presence of similar current readings at $A_1$ and $A_2$ validates a normal operation (closed switch). This is re-validated by the voltage measurement, where absence or very low voltage indicates a closed switch. During an open switch (shorted CT), dissimilar current readings (presence of current at $A_2$ and no current at $A_1$) indicates an open switch (shorted CT). This is re-validated by the voltage measurement, where a presence of voltage indicates an open switch. If no current is measured at either $A_1$ or $A_2$, but a voltage is developed across the switch, this indicates an open current transformer, (i.e. the switch is open but not short-circuited) a potentially dangerous condition.

Figure 16:
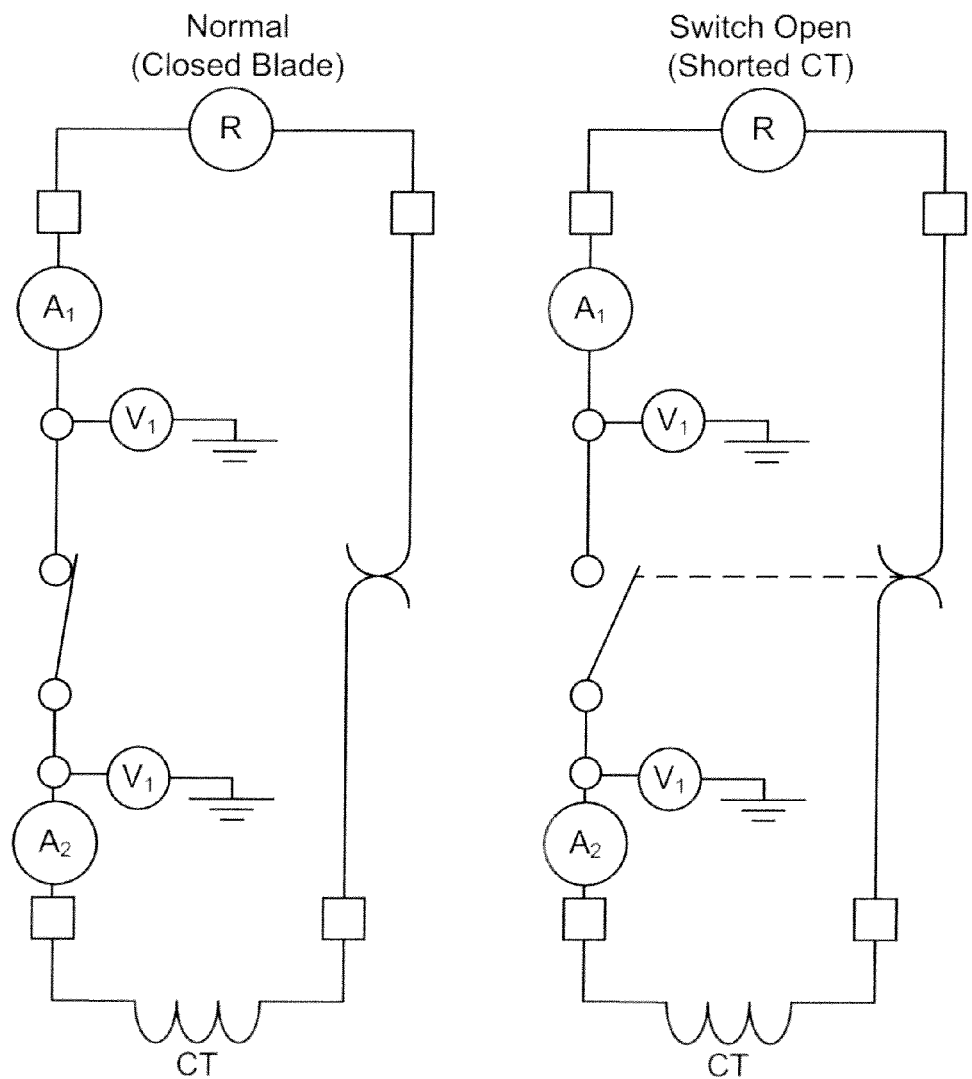
FIG. 16 is a schematic view of a fifth monitoring scheme for a ganged current switch.

With reference now to FIG. 16, in a ganged current switch, current at both the load and supply side of the switch are measured. Also, the voltage is measured relative to ground or a reference point on the load side and supply side of the switch. During a closed switch (or normal) operation, the presence of similar current readings at $A_1$ and $A_2$ validates a normal operation (closed switch). This is re-validated by the voltage measurement, where if $V_1=V_2$ this indicates a closed switch. During an open switch (shorted CT), dissimilar current readings (presence of current at $A_2$ and no current at $A_1$) indicates an open switch (shorted CT). This is re-validated by the voltage measurement, where a presence of voltage at $V_1$ but not at $V_2$ indicates an open switch. If no current is measured at either $A_1$ or $A_2$, but a voltage is developed at $V_1$, this indicates an open current transformer, (i.e. the switch is open but not short-circuited) a potentially dangerous condition.

Figure 17:
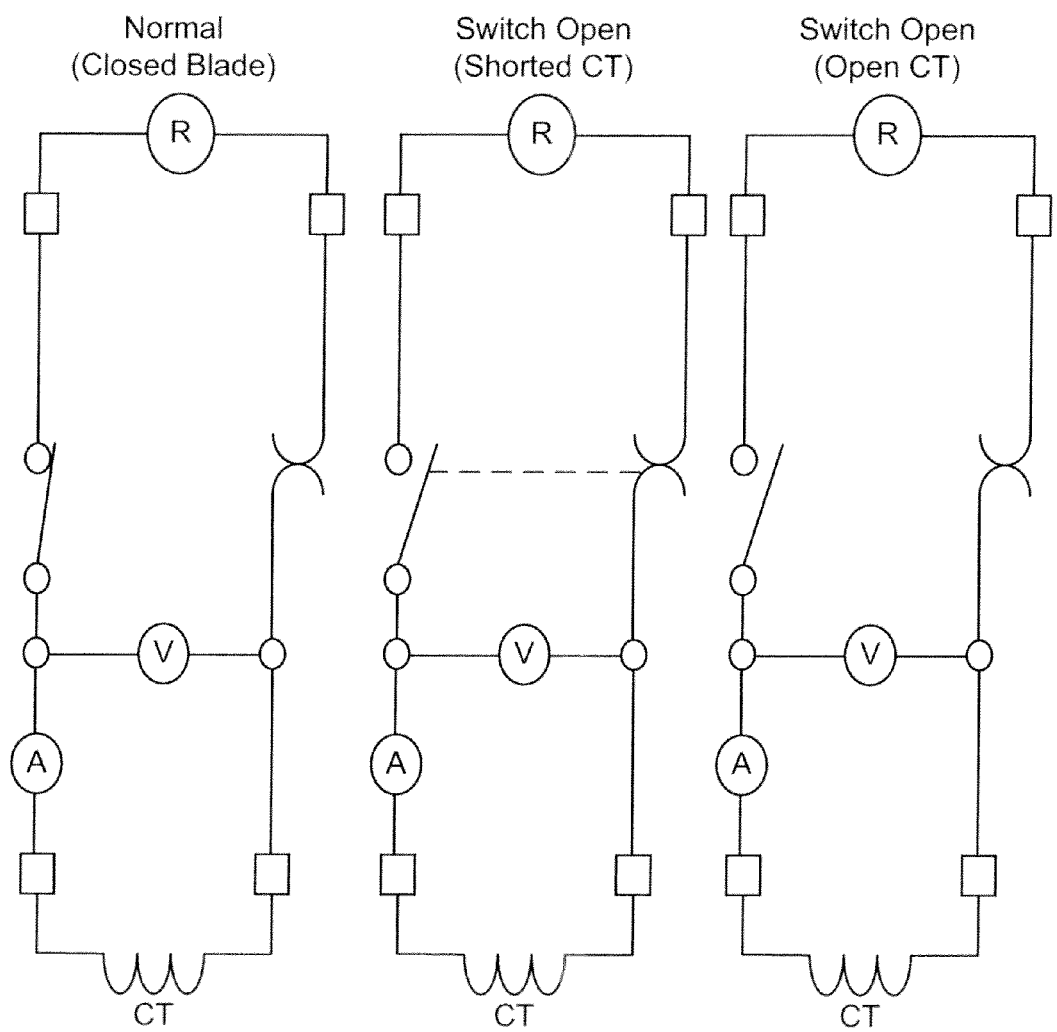
FIG. 17 is a schematic view of a sixth monitoring scheme for a ganged current switch.

With reference now to FIG. 17, in a ganged current switch, only two measurements are made, one voltage and one current. The minimal number of sensors make this embodiment economically advantageous. Current is measured at the supply side of the switch and voltage is measured across the current transformer. A switch sensor configuration according to this embodiment is capable of detecting closed blade (normal operation), open blade (shorted CT), power off, and can also detect an open current transformer condition at any location in the circuit.

According to this embodiment, a positive current and non-zero voltage will be measured when the switch is closed in normal operation. If the switch is open in a shorted CT configuration, a positive current will be measured but the measured voltage will be zero or very close to zero. In an open current transformer condition, zero current will be measured, however a voltage will be seen. In a zero power situation, zero voltage and current will be measured.

According to this embodiment, in addition to the monitoring functions, a set of failsafe contacts may be provided to short the test switch terminals (across V) if an open CT condition is identified. This provides added safety to the user and avoids damage to downstream devices (like the protective relay). This failsafe contacts may also be provided at the current transformer terminal instead of the switch.

Figure 18:
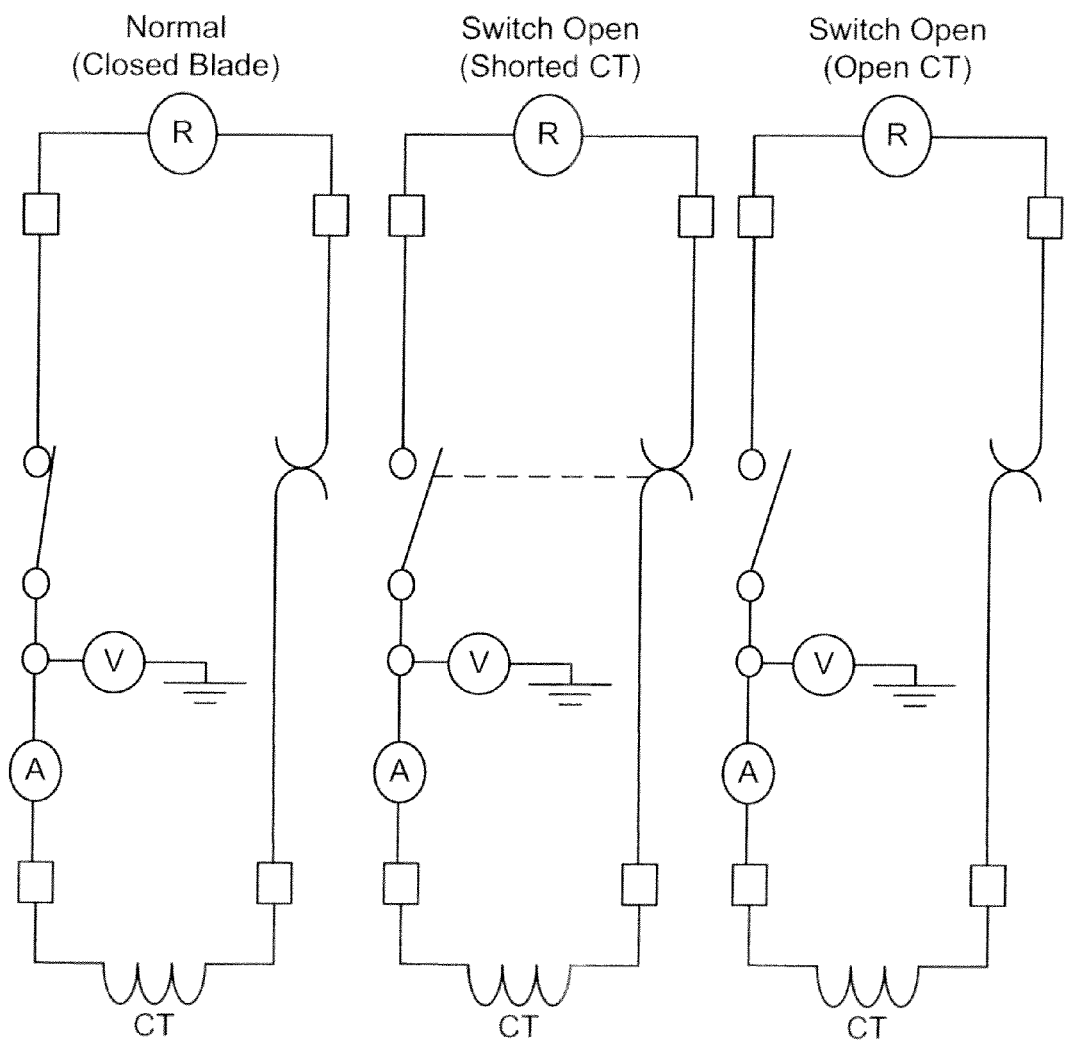
FIG. 18 is a schematic view of a seventh monitoring scheme for a ganged current switch.

Other configurations are contemplated, wherein the voltage and current are measured at a single location each. For example, with reference now to FIG. 18, a monitoring configuration is shown which is substantially the same as FIG. 17, however, instead of measuring voltage across the current transformer, the voltage is monitored at the input or output of the CT relative to ground or a reference voltage.

According to this embodiment, a positive current and non-zero voltage will be measured when the switch is closed in normal operation. If the switch is open in a shorted CT configuration, a positive current and voltage will also be measured. In an open current transformer condition, zero current will be measured, however a voltage will be measured. In a zero power situation, zero voltage and current will be measured.

As will be appreciated by one of ordinary skill in the art, various functions in the present invention may be embodied as or take the form of a computer readable medium having computer-readable instructions stored thereon which, when executed by a processor, carry out the operations of the present inventions as previously described. The computer-readable medium may be any medium that can contain, store, communicate, propagate, or transport the user-interface program instruction for use by or in connection with the instruction execution system, apparatus, or device and may by way of example but without limitation, be an electronic, magnetic, optical, electromagnetic, infrared, or semiconductor system, apparatus, device, or propagation medium or other suitable medium upon which the program is printed. More specific examples (a non-exhaustive list) of the computer-readable medium would include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the present invention may be written in any suitable programming language provided it allows achieving the previously described technical results.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

I claim:

1. A switch assembly for selectively opening and closing the electrical connection between a protective relay and a potential or current sensor, comprising:
   a plurality of individual switches including blades movable between an open and a closed position, said switches being electrically connected between the protective relay and the potential or current sensor;
   a switch position sensor in each of said plurality of individual switches capable of sensing when the blade is in proximity to the sensor and positioned to be sufficiently close to the blade when the switch is in the closed position to sense the blade; and
   an indicator that optically displays whether any one of said blades is in the open position based on signals from said switch position sensors.

2. The switch assembly of claim 1 wherein said blade includes a handle and said handle includes an imbedded RFID tag and said switch position sensor is an RFID sensor.

3. The switch assembly of claim 1 wherein said blade includes a handle and said handle includes an imbedded magnet and said switch position sensor is a hall effect sensor.

4. The switch assembly of claim 1 wherein said switch position sensor is an optical sensor.

5. The switch assembly of claim 1 wherein said indicator includes one or more LEDs capable of alternately emitting a green light when all said switch blades are closed or a red light when at least one of said switch blades are open.

6. A switch assembly for selectively opening and closing the electrical connection between a protective relay and a potential or current sensor, comprising:
   a plurality of individual switches including blades movable between an open and a closed position, said switches being electrically connected between the protective relay and the potential or current sensor;
   a switch position proximity sensor in each of said plurality of individual switches positioned to be sufficiently proximate to the blade when the blade is in the closed position to detect the blade; and,
   an indicator that optically displays whether any one of said blades is in the open position based on signals from said switch position sensors.

* * * * *